(12) United States Patent
Bond et al.

(10) Patent No.: US 6,388,331 B1
(45) Date of Patent: May 14, 2002

(54) BOND PAD HAVING REDUCED CAPACITANCE AND METHOD FOR REDUCING CAPACITANCE OF A BOND PAD

(75) Inventors: Aaron Eugene Bond, Allentown; Marlin Wilbert Focht, Williams Township, County of Northampton, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/505,750

(22) Filed: Feb. 16, 2000

(51) Int. Cl.$^7$ ................................................. H01L 23/48
(52) U.S. Cl. ..................... 257/773; 257/786; 257/781; 257/784; 257/758; 257/734
(58) Field of Search ................................. 257/786, 781, 257/773, 784, 758, 734

(56) References Cited

U.S. PATENT DOCUMENTS

| | | |
|---|---|---|
| 5,577,944 A | 11/1996 | Taylor |
| 5,587,336 A | 12/1996 | Wang et al. |
| 5,976,964 A | 11/1999 | Ball |

FOREIGN PATENT DOCUMENTS

| | | | |
|---|---|---|---|
| JP | 363141330 A | * | 6/1988 |
| JP | 363161634 A | * | 7/1988 |
| JP | 401309340 A | * | 12/1989 |

* cited by examiner

Primary Examiner—Minh Loan Tran
Assistant Examiner—Luan Thai
(74) Attorney, Agent, or Firm—Lowenstein Sandler PC

(57) ABSTRACT

A bond pad having reduced capacitance is disclosed which is useful in fabricating integrated circuit and communications devices. The bond pad is disposed within a select bond pad area and comprises a ribbon of conductive material within the select pad area and a two-phased region of air and conductive material. Also, at least one interconnect area is disposed within the bond pad area. The ribbon is coupled to the two-phased region, and the interconnect is coupled to the ribbon and to the device. Inclusion of air within the bond pad structure reduces the capacitance of the device, while the surface area of the bonding pad is maintained to at least substantially retain the adhesive properties of the pad.

14 Claims, 2 Drawing Sheets

BOND PAD HAVING REDUCED CAPACITANCE AND METHOD FOR REDUCING CAPACITANCE OF A BOND PAD

FIELD OF THE INVENTION

The present invention relates to a bond pad having reduced capacitance which is useful in fabricating integrated circuit and communications devices and to a method of reducing the capacitance of a bond pad.

BACKGROUND OF THE INVENTION

Communications systems typically include a variety of devices (e.g., integrated circuits, light sources, photodetectors, switches, optical fibers, amplifiers, filters, and so forth). Communications systems are useful for transmitting information, such as information relayed by optical signals, over long distances at high speeds. As communications systems become more advanced, signals are being transmitted at higher frequencies. However, high-speed devices are plagued by parasitic capacitances that can be detrimental to the performance. A major contributor to parasitic capacitance is that associated with bond pads.

Bond pads find many applications in connecting integrated circuit devices and components of communications systems. See, e.g., U.S. Pat. No. 5,976,964 to Ball, "*Method of Improving Interconnect of Semiconductor Device by Utilizing a Flattened Ball Bond*"; U.S. Pat. No. 5,587,336 to Wang et al., "*Bump Formation on Yielded Semiconductor Dies*," and U.S. Pat. No. 5,577,944 to Taylor, "*Interconnect for Use in Flat Panel Display*," incorporated herein. A top view of a communications device including a typical bond pad is schematically illustrated in FIG. 1A, with a side view shown in FIG. 1B. The bond pad 10, which typically is fabricated with gold (Au), is disposed on a substrate 8 with an insulating layer 11 therebetween (hidden from view in FIG. 1A). The insulating layer 11 may be comprised, for example, of $SiO_2$ or semi-insulating InP. The bond pad 10 is connected to the device 12 by an interconnect 13 which may take various dimensions. For example, the interconnect may be fabricated with the same material as the bond pad, comprise a bond wire, or be fabricated with other materials as known in the field.

A large bond pad is disadvantageous with regard to the system capacitance, but is used to achieve good adhesion of the pad to the insulating layer and interconnect. The interconnect does not require a large surface area to achieve a good electrical connection. As may be appreciated, it would be advantageous to provide a bond pad that maintains the advantages of achieving good adhesion and yet has less parasitic capacitance.

SUMMARY OF THE INVENTION

Summarily described, the invention embraces a bond pad structure that has a reduced capacitance and yet maintains good adhesion and electrical connection properties. The bond pad is adapted for coupling a device with an interconnect. The bond pad is disposed within a select pad area. It includes a two-phased region of air and conductive bonding material within the select pad area and a ribbon of conductive material within the select pad area overlapping the two-phased region. An interconnect is coupled to the ribbon and to the device. In a preferred embodiment, the regions of air and bonding material define a mesh geometry. Including air within the bond pad structure reduces the capacitance of the device, while the surface area of the bonding pad is maintained to at least substantially retain the adhesive properties of the pad. The ribbon of conductive material maintains good electrical properties for the bond pad.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Figure 2:
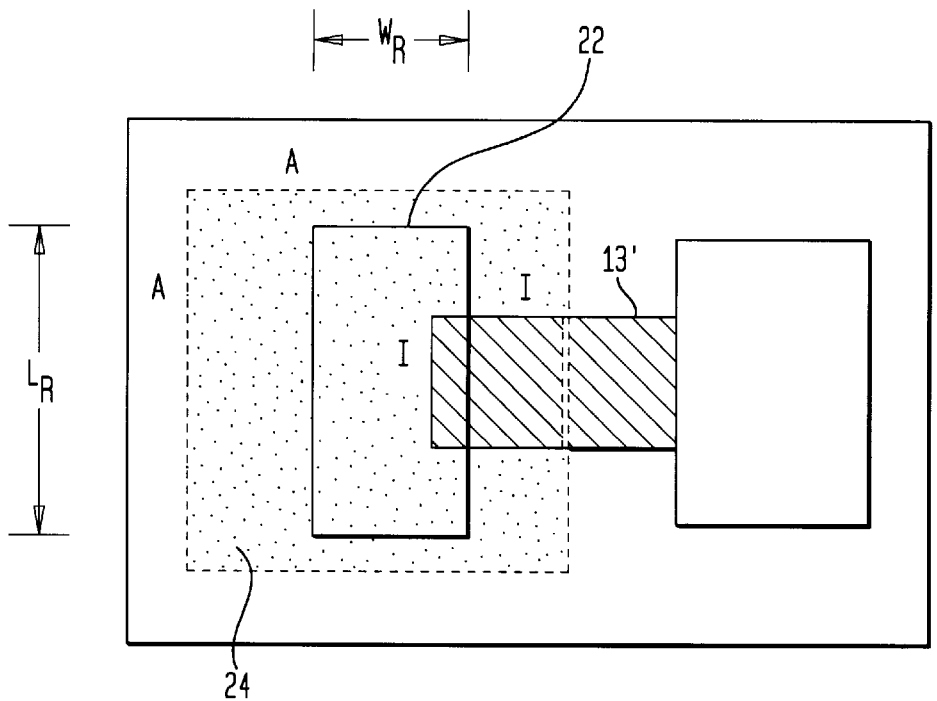
FIG. 2 is a schematic top view of an integrated circuit device connected to a bond pad having reduced capacitance according to the invention.

The invention comprises a bond pad that has a reduced capacitance and yet maintains good adhesion and electrical connection properties. Referring to FIG. 2, there is shown a schematic representation outlining the structure for a preferred embodiment of the inventive bond pad. The bond pad has a structure that covers a select bond pad area outlined by the dashed lines defining boxed region A—A. Within this bond pad area A—A, there is disposed an electrically conductive ribbon 22 and a two-phased region of air and conductive bonding material. By stating there is a "two-phased region" within bond pad area A—A, it is meant that at least a portion of the surface area of the device outlined by boxed region A—A comprises two phases, e.g., air and conductive material. Preferably, the geometry at the select bond pad area A—A comprises a mesh or dot pattern of air and conductive material, e.g., the bond pad can be fabricated by a dot pattern of conductive material being deposited over the bond pad area, or by a solid layer of conductive material being deposited over the bond pad area with holes then etched or punched therein. The device will have an interconnect region I—I, outlined by the dashed lines defining boxed region I—I, which is the region over which the interconnect 13' overlaps the bond pad area. The device thus will have a remaining pad region 24 comprising the portion of the bond pad area A—A that is not overlapped with interconnect. The interconnect region I—I may be two phased, having a mesh geometry or holes etched into the conductive layer (e.g., as shown in FIG. 3B) or other geometries comprising regions of air and bonding material. However, preferably, the interconnect region I—I does not have a dot pattern but rather, is either a substantially solid conductive layer or a conductive layer having regions of air placed therein.

In FIG. 2, the bond pad area is outlined by the boxed region A—A. The inventive bond pad structure is placed within the bond pad area A—A, that is, within bond pad area A—A, there is disposed the conductive ribbon and the two-phased region of air and conductive material. The pad area A—A may be substantially the same as that area consumed by traditional bonding pads, which may depend on the device application. For example, the area A—A may be about 100 μm×100 μm in size. The interconnect region I—I may be comprised of two-phases but also may be comprised of a substantially solid or continuous conductive layer. Preferably, the two-phased region includes the interconnect region I—I and comprises about 60–80% air with the remainder bonding material, and most preferably, the two-phased region (including interconnect region I—I ) comprises about 75% air. Reducing the ratio of bonding material to air can reduce the capacitance. On the other hand, a larger ratio of bonding material to air can help maintain good electrical contact. Preferably, the entire bond pad area A—A has a mesh geometry with regions of air (~75%) and bonding material, and for ease of fabrication, the same geometry is maintained over the interconnect region I—I and the remaining pad area 24.

Figure 1A:
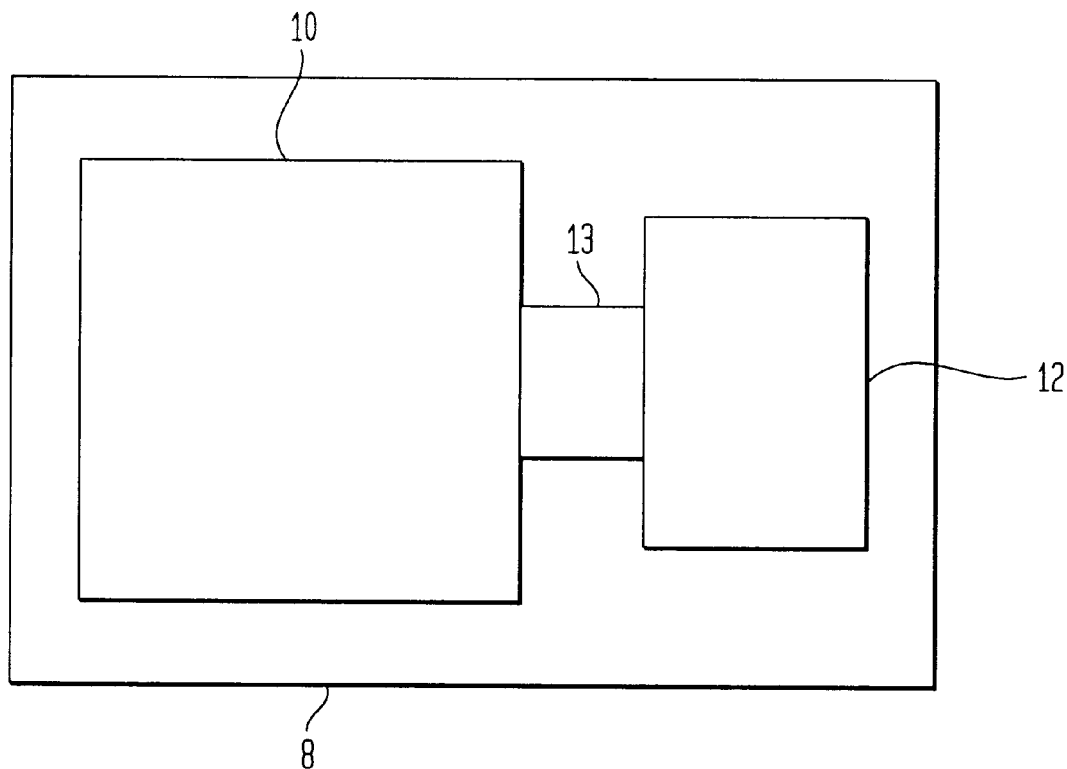
FIG. 1A is a schematic top view of an integrated circuit device connected to a bond pad.
Figure 1B:
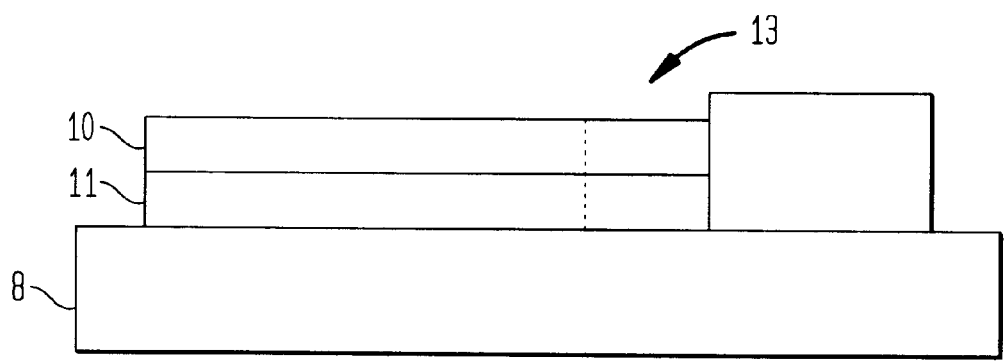
FIG. 1B is a side view of the device assembly of FIG. 1A.
Figure 3A:
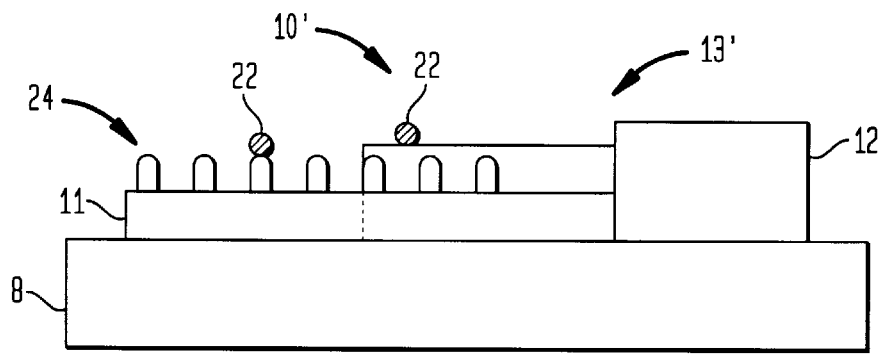
FIG. 3A is a cross-sectional side view of one exemplary inventive bond pad device.
Figure 3B:
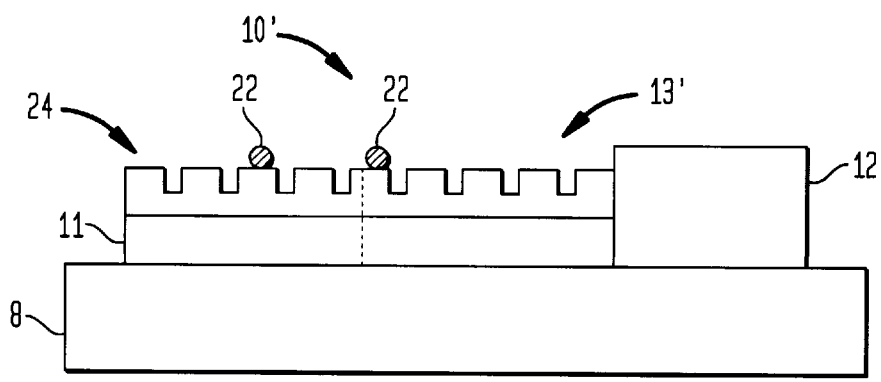
FIG. 3B is a cross-sectional side view of an alternative inventive bond pad device.

FIGS. 3A–3B illustrate exemplary cross-sectional side views for the inventive device. As in FIG. 1A, the bond pad structure is disposed on a substrate 8 with an insulating layer 11 therebetween, wherein the layer 11 may be comprised Of $SiO_2$ or semi-insulating insulating InP, and the pad 10' is connected to the device 12 by an interconnect 13' which may take various dimensions or comprise a bond wire. The bond pad structure 10' is defined by at least two components, the ribbon component 22 and a two-phased region which may comprise a dot pattern at the remaining pad area 24 (FIG. 3A), or a mesh at both the interconnect region and the remaining pad area 24 (FIG. 3B). The ribbon 22 advantageously is comprised of gold. With the use of this ribbon/two-phased configuration, the capacitance of the bonding pad is substantially reduced while the adhesive properties of the pad are maintained. The capacitance of the bond pad structure is reduced given the presence of air where previously bonding material was used. Where there is air in the bond pad area A—A, there is an effective parallel plate capacitor in series, one capacitor from the air and the other from the insulating material (e.g., $SiO_2$). With this invention, advantageously the RC time constant is reduced while a relatively large pad area is maintained which is effective for bonding. In FIG. 3A, the interconnect 13' comprises a solid or continuous layer of conductive material (without a mesh or dotted geometry or regions of air), whereas the remaining pad region 24, not overlapping the interconnect, has a dot pattern. In FIG. 3B, the entire bond pad area including the interconnect region (overlapped with interconnect 13') comprises a meshed region of conductive material and air, i.e., holes or voids have been punched into the layer of conductive material.

The ribbon 22 may take on many geometries, such as circular, square, rectangular, and so forth. In a preferred embodiment, the ribbon comprises a rectangular geometry oriented proximal the center of the bond pad area A—A. Advantageously, the ribbon covers a substantial section of the bonding area. For example, for a bond pad area A—A sized at 100 μm×100 μm, the length $L_R$ of the ribbon (FIG. 2), may be 50 μm and the width $W_R$ may be 20 μm. The width of the ribbon itself $R_W$ is relatively small and dimensioned at about 5–10 μm. Other sizes naturally may be used as well. Reducing the size of the ribbon will reduce the capacitance. On the other hand, a larger-sized ribbon helps to maintain good electrical contact with the interconnect 13 and the device 12. One skilled in the field can determine the optimal-sized ribbon given these considerations depending on the application. A preferred material for the ribbon comprises gold. However, aluminum and other conductive materials known in the field may be used.

The mesh and ribbon configurations can be deposited applying methods known in the field, such as by photolithography, sputtering and selective etching techniques.

EXAMPLE 1

The capacitance of the bond pad can be calculated as a function of the dimensions for the pad. For example, the total capacitance of the pad is given by the relation:

$$C_{pad} = A\epsilon_{SiO2}/d_{SiO2} = 0.69 pF,$$

where A is the area of the pad, $\epsilon_{SiO2}$ is the dielectric constant of the insulating layer 11, and $d_{SiO2}$ is the thickness of the insulating layer. A typical bond pad has a size of about 100 μm×100 μm in size, with the interconnect being about 10 μm long by 20 μm wide. Given those dimensions, with a prior art device where the pad is conductive, the capacitance of the interconnect as calculated with the above equation is 0.0138 pF, for a total device capacitance of 0.7 pF. If the circuit is assumed to have a single pole dependence with a 50 Ω resistance and a negligible device capacitance, then the 3 dB frequency is:

$$F_{3dB} = 1/2\pi RC = 4.62 \text{ GHz},$$

in which R is 50 Ohms and C is 0.7 pF.

However, consider the example where the bonding structure of FIGS. 2 and 3B is used, including a bonding ribbon 22 and an air(75%)-gold(25%) mesh within bond area A—A. The capacitance is governed by the area of the ribbon 22, and the area where the interconnect overlaps with the mesh structure, outlined in FIG. 2 by boxed area I—I The regions of the select bond pad area A—A that neither include the ribbon 22 nor overlapping area I—I add no capacitance to the structure. In the regions where there is gold, i.e., where the gold ribbon 22 and gold dots of the mesh are deposited, the capacitance per square micron is =0.069 fF. For the regions within area I where there is air, the capacitance per square micron is approximately 0.002 fF. Accordingly, the total capacitance can be calculated given a ribbon dimension of 20 μm wide by 50 μm long and a region I—I of 75 μm by 50 μm. The capacitance from the ribbon area is 20×50×0.069 fF/μm²=69 fF. If the interconnection region I—I comprises 25% gold and 75% air, then the capacitance from the gold dots in the interconnect region I—I is 0.25×(55×50)×0.079 fF/μm²=44.4 fF, and the capacitance from the air in this region I—I is 0.75×(55×50)×0.002 fF/μm²=4.12 fF. The total capacitance from the pad of FIG. 3A is then 69+47.4+4.12=0.237 pF. The new 3 dB frequency with the same assumptions as before =13.65 GHz.

It is understood that the embodiments described herein are merely exemplary and that a person skilled in the art may make variations and modifications without departing from the spirit and scope of the invention. All such variations and modifications are intended to be included within the scope of the appended claims.

We claim:

1. An article including a bond pad for coupling to a device via an interconnect layer, the bond pad comprising:
   a two-phased region of air and conductive bonding material deposited within a select bond pad area and a ribbon of conductive material within the select bond pad area, wherein the ribbon is in contact with the two-phased region, and the interconnect layer is coupled to the ribbon and to the device, the interconnect layer overlapping the select bond pad area overlapping at an area defining an interconnect region.

2. The article of claim 1 in which the two-phased region is deposited over substantially the entire select bond pad area including the interconnect region.

3. The article of claim 1 in which the two-phased region is deposited over a portion of the select bond pad area excluding the interconnect region.

4. The article of claim 3 in which the interconnect region comprises a continuous layer of conductive material.

5. The article of claim 1 in which the two-phased region of air and conductive bonding material defines a dot pattern.

6. The article of claim 1 in which the two-phased region of air and conductive bonding material defines a mesh geometry.

7. The article of claim 1 in which the ribbon is comprised of gold.

8. The article of claim 1 in which the two-phased region comprises approximately 60–80% air.

9. The article of claim 1 in which the two-phased region comprises approximately 75% air.

10. The article of claim 1 in which the area of the select bond pad area is sized at approximately 100 µm×100 µm and the 3 dB frequency of the bond pad is approximately 13.65 GHz.

11. An article including a bond pad structure adapted for coupling a device with an interconnect layer, the bond pad structure comprising:

a substrate;

an insulating layer deposited on the substrate;

a two-phased bonding layer disposed on the insulating layer wherein the two-phased layer defines a bond pad area and is comprised of about 60–80% air and about 20–40% conductive bonding material;

a ribbon of conductive material coupled to the two-phased bonding layer; and the interconnect layer coupled to the ribbon and to the device, wherein the interconnect layer overlaps the two-phased bonding layer and has substantially the same ratio of air and conductive bonding material as the two-phased bonding layer.

12. A method for reducing the capacitance of a bond pad covering a select bond pad area over which is deposited an interconnect for coupling a device, the method comprising defining a two-phased region of air and conductive material within the select bond pad area and a ribbon of conductive material overlapping the two-phased region and coupling the pad to the interconnect.

13. An integrated circuit device including the article of claim 1.

14. An integrated circuit device including the article of claim 11.

* * * * *